United States Patent
Krames

(10) Patent No.: US 7,888,691 B2
(45) Date of Patent: Feb. 15, 2011

(54) LIGHT SOURCE INCLUDING A WAVELENGTH-CONVERTED SEMICONDUCTOR LIGHT EMITTING DEVICE AND A FILTER

(75) Inventor: Michael R. Krames, Los Altos, CA (US)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 42 days.

(21) Appl. No.: 12/201,428

(22) Filed: Aug. 29, 2008

(65) Prior Publication Data

US 2010/0051974 A1    Mar. 4, 2010

(51) Int. Cl.
*H01L 33/00*    (2010.01)
(52) U.S. Cl. .................... 257/89; 257/E33.067
(58) Field of Classification Search .................. 257/79, 257/89, 80, 90, 94, 96, E51.018, 103
See application file for complete search history.

(56) References Cited

U.S. PATENT DOCUMENTS

| | | | |
|---|---|---|---|
| 5,813,752 A | 9/1998 | Singer et al. | |
| 5,813,753 A | 9/1998 | Vriens et al. | |
| 5,952,681 A | 9/1999 | Chen | |
| 5,962,971 A | 10/1999 | Chen | |
| 6,155,699 A | 12/2000 | Miller et al. | |
| 6,340,824 B1 | 1/2002 | Komoto et al. | |
| 6,717,355 B2 | 4/2004 | Takahashi et al. | |
| 6,744,077 B2 | 6/2004 | Trottier et al. | |
| 7,026,663 B2 * | 4/2006 | Krames et al. | ............... 257/103 |
| 7,361,938 B2 | 4/2008 | Mueller et al. | |
| 2003/0227249 A1 | 12/2003 | Mueller et al. | |
| 2004/0021859 A1 | 2/2004 | Cunningham | |
| 2005/0269582 A1 | 12/2005 | Mueller et al. | |

FOREIGN PATENT DOCUMENTS

| | | |
|---|---|---|
| EP | 1220332 A2 | 7/2002 |
| WO | 2006035388 A2 | 4/2006 |
| WO | 2007036214 A1 | 4/2007 |
| WO | 2008025723 A1 | 3/2008 |

* cited by examiner

*Primary Examiner*—Davienne Monbleau
*Assistant Examiner*—Hoa B Trinh

(57) ABSTRACT

A semiconductor light emitting device comprises a light emitting layer disposed between an n-type region and a p-type region. The light emitting layer is adapted to emit first light having a first peak wavelength. A first wavelength converting material is adapted to absorb the first light and emit second light having a second peak wavelength. A second wavelength converting material is adapted to absorb either the first light or the second light and emit third light having a third peak wavelength. A filter is adapted to reflect fourth light having a fourth peak wavelength. The fourth light is either a portion of the second light or a portion of the third light. The filter is configured to transmit light having a peak wavelength longer or shorter than the fourth peak wavelength. The filter is disposed over the light emitting device in the path of at least a portion of the first, second, and third light.

14 Claims, 3 Drawing Sheets

LIGHT SOURCE INCLUDING A WAVELENGTH-CONVERTED SEMICONDUCTOR LIGHT EMITTING DEVICE AND A FILTER

BACKGROUND

Semiconductor light emitting devices such as light emitting diodes (LEDs) are among the most efficient light sources currently available. Material systems currently of interest in the manufacture of high brightness LEDs capable of operation across the visible spectrum include group III-V semiconductors, particularly binary, ternary, and quaternary alloys of gallium, aluminum, indium, and nitrogen, also referred to as III-nitride materials; and binary, ternary, and quaternary alloys of gallium, aluminum, indium, arsenic, and phosphorus. Often III-nitride devices are epitaxially grown on sapphire, silicon carbide, or III-nitride substrates and III-phosphide devices are epitaxially grown on gallium arsenide by metal organic chemical vapor deposition (MOCVD), molecular beam epitaxy (MBE), or other epitaxial techniques. Often, an n-type region is deposited on the substrate, then a light emitting or active region is deposited on the n-type region, then a p-type region is deposited on the active region. The order of the layers may be reversed such that the p-type region is closer to the substrate.

One promising use of semiconductor light emitting devices is for backlights in liquid crystal displays (LCDs). LCDs are commonly used in cellular phones, personal digital assistants (PDAs), portable music players, laptop computers, desktop monitors, and television applications. One embodiment of the present invention is a color or monochrome, transmissive LCD that requires backlighting, where the backlight may use one or more LEDs emitting white or colored light.

SUMMARY

Embodiments of the invention include a semiconductor light emitting device comprising a light emitting layer disposed between an n-type region and a p-type region. The light emitting layer is adapted to emit first light having a first peak wavelength. A first wavelength converting material such as a phosphor is adapted to absorb the first light and emit second light having a second peak wavelength. A second wavelength converting material such as a phosphor is adapted to absorb either the first light or the second light and emit third light having a third peak wavelength. A filter is adapted to reflect fourth light having a fourth peak wavelength. The fourth light is either a portion of the second light or a portion of the third light. The filter is configured to transmit light having a peak wavelength longer or shorter than the fourth peak wavelength. The filter is disposed over the light emitting device in the path of at least a portion of the first, second, and third light.

Embodiments of the invention may be used in a liquid crystal display. The display includes at least one light source including a semiconductor light emitting device, a liquid crystal layer, and a first filter layer disposed between the at least one light source and the liquid crystal layer. The first filter layer includes a plurality of red pixel locations, green pixel locations, and blue pixel locations. Each pixel location is adapted to transmit light of the desired color and absorb light of the other two colors. The display includes a second filter layer disposed between first filter layer and the light source. The second filter layer is adapted to transmit the red, green, and blue light transmitted by the first filter layer, and reflect light at a wavelength that is absorbed by the first filter layer.

DETAILED DESCRIPTION

Conventional white-emitting LEDs typically include a blue-emitting LED with a phosphor coating, often $Y_3Al_5O_{12}$:$Ce^{3+}$, that absorbs some of the blue light and emits yellow light. The combination of blue and yellow light appears white. Such phosphor-converted LEDs are efficient, but provide a poor color gamut for LCD backlighting, due to a lack of red light in the spectrum.

Figure 1:
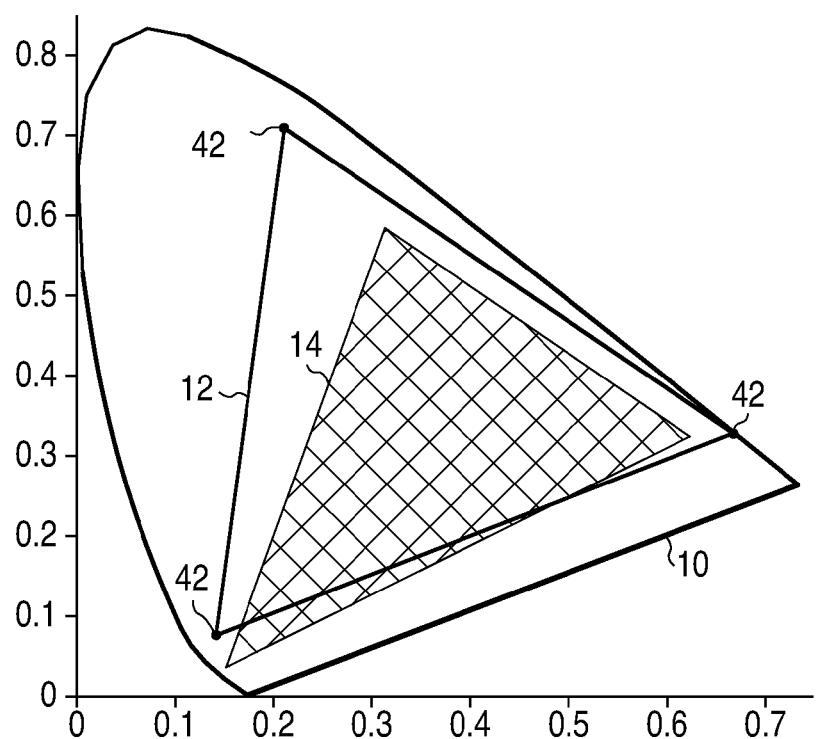
FIG. 1 illustrates the gamut of a phosphor-converted LED and the NTSC standard on a CIE 1931 chromaticity diagram.

The "gamut" of a device is the portion of the color space that can be produced by the device. FIG. 1 illustrates the gamut of a phosphor-converted LED and the NTSC standard. Area 10 of FIG. 1 is the CIE 1931 chromaticity diagram, which is a mathematical representation of all colors. Triangle 12 is the gamut for NTSC, a color standard for television. Gray area 14 is the gamut for a blue+yellow phosphor-converted LED, as described above. The phosphor converted LED shown in FIG. 1 is capable of producing a gamut that is only 69% as large as the NTSC gamut.

In accordance with embodiments of the invention, phosphor-converted LEDs for backlighting may include yellow/green phosphors, red phosphors, and one or more filters, in order to improve the gamut of the backlight.

Figure 2:
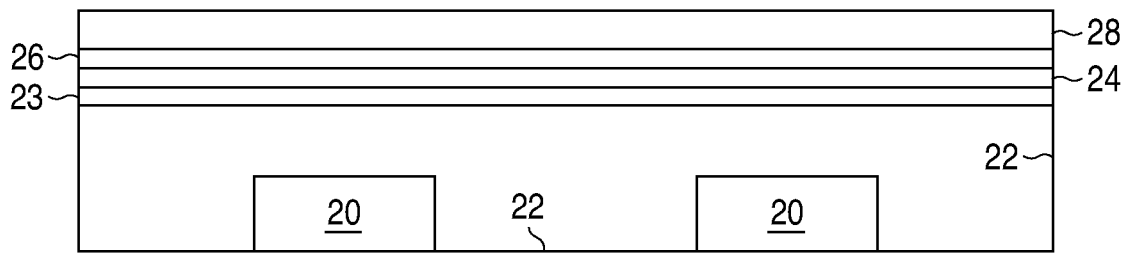
FIG. 2 is a cross sectional view of a portion of a liquid crystal display.
Figure 9:
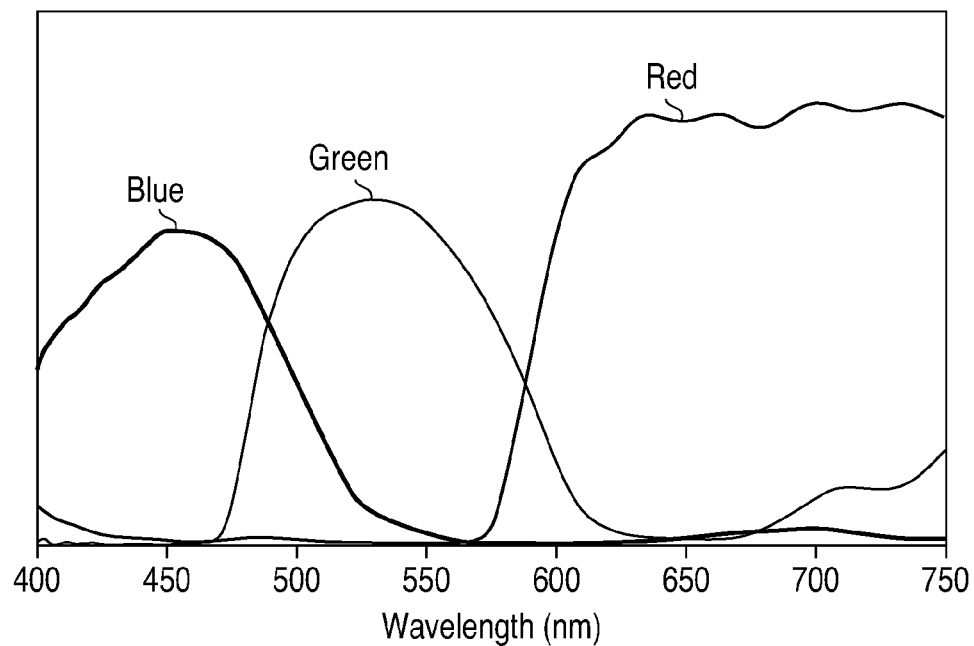
FIG. 9 illustrates the transmission spectra of red, green, and blue filters used in a liquid crystal display device.

FIG. 2 illustrates a portion of an LCD. One or more phosphor-converted LEDs 20 which form the backlight for the display are disposed in a box with reflective inner surfaces 22. A top diffuser sheet 23 (e.g., a roughened plastic sheet), and one or more brightness enhancement films (BEFs) 24 may be disposed over the box. The diffuser sheet 23 improves the brightness uniformity across the surface of the backlight. The BEFs 24 may be formed by a micro-prism pattern in a plastic sheet that redirects light within a narrow angle toward the viewer. A liquid crystal layer 28, which is disposed over the backlight, essentially has a controllable shutter at each red, green, and blue pixel location, for displaying a color image. Filter layer 26, disposed between BEFs 24 and liquid crystal layer 28 has a red, green, or blue filter at the corresponding RGB pixel locations. Filter layer 26 only passes the intensity-modulated red, green, or blue component, absorbing the unneeded components at each pixel location. The transmission spectra of the red, green, and blue components of filter layer 26 are illustrated in FIG. 9.

Figure 3:
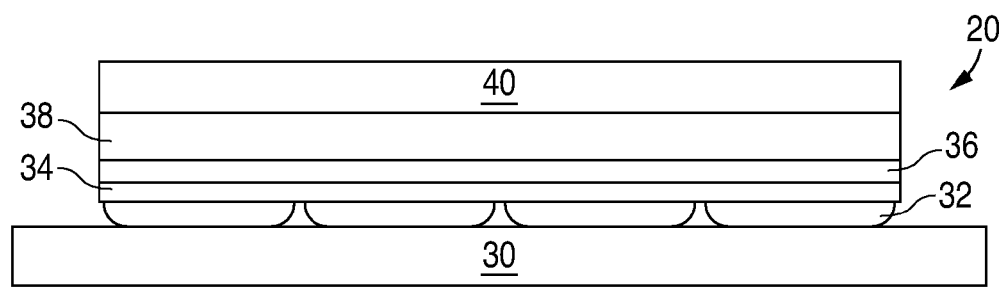
FIG. 3 is a cross sectional view of a phosphor-converted LED according to embodiments of the invention.

FIG. 3 illustrates one embodiment of a phosphor-converted LED used for backlighting. Device 20 includes a semiconductor structure 34, including one or more light emitting layers sandwiched between an n-type region and a p-type region. In some embodiments, the semiconductor structure is a III-nitride structure, and the light emitting layers are configured to emit blue light, though any suitable semiconductor structure may be used. A III-nitride structure is typically grown on a sapphire or SiC growth substrate by growing the n-type region, followed by the light emitting region, followed by the p-type region. The growth substrate may be removed from the semiconductor structure after growth.

The n-type region may include multiple layers of different compositions and dopant concentration including, for example, preparation layers such as buffer layers or nucleation layers which may be n-type or not intentionally doped, release layers designed to facilitate later release of the growth substrate or thinning of the semiconductor structure after substrate removal, and n- or even p-type device layers designed for particular optical or electrical properties desirable for the light emitting region to efficiently emit light.

The light emitting region is grown over the n-type region. Examples of suitable light emitting regions include a single thick or thin light emitting layer and a multiple quantum well light emitting region including multiple thin or thick quantum well light emitting layers separated by barrier layers. For example, a multiple quantum well light emitting region may include multiple InGaN light emitting layers separated by GaN or InGaN barriers. One or more light emitting layers in the device may be doped, for example with Si, or the light emitting layer or layers may be not intentionally doped.

The p-type region is grown over the light emitting region. Like the n-type region, the p-type region may include multiple layers of different composition, thickness, and dopant concentration, including layers that are not intentionally doped, or n-type layers.

Electrical contacts are formed on the n- and p-type regions. A portion of the p-type and light emitting regions may be etched away to reveal a surface of the n-type region on which the electrical contact is formed. Interconnects 32 connect semiconductor structure 34 to a base 30 for example, by solder, a thermocompression bond, an interdiffusion bond, or a Au stud bump array bonded by an ultrasonic weld.

Base 30 may be formed of an electrically insulating material such as AlN, with conductive contact pads such as gold pads on the bottom of the base connected to solderable electrodes on the top of the base using conductive vias and/or metal traces. The base may be formed of a conducting material if passivated to prevent shorting, such as anodized AlSiC. Base 30 may be thermally conductive to act as a heat sink or to conduct heat to a larger heat sink.

After semiconductor structure 34 is connected to base 30, the growth substrate may be removed.

One or more wavelength converting layers 36 and 38 are disposed over the top surface of semiconductor structure 34. In some embodiments, the wavelength converting layer 36 adjacent to semiconductor structure 34 includes a powder phosphor disposed in a transparent material. The transparent material acts as an adhesive to attach a second wavelength converting layer 38 to semiconductor structure 34. Wavelength converting layer 38 may be, for example, a ceramic phosphor, as described in more detail in U.S. Pat. No. 7,361, 938, which is incorporated herein by reference. In some embodiments, wavelength converting layer 36 may also be a ceramic phosphor. In some devices, wavelength converting layer 36 includes one or more phosphors that emit red light, and wavelength converting layer 38 includes one or more phosphors that emit yellow or green light. In some embodiments, multiple phosphors are mixed together and disposed over the semiconductor structure in a single layer. For example, a red-emitting phosphor and a yellow/green-emitting phosphor may be mixed together and disposed in a slurry of transparent material such as silicone, which is placed in a mold positioned over the semiconductor structure. The mold may be shaped, for example as a lens. The structure is then heated to cure the silicone, then the mold is removed, leaving the mixture of phosphors inside a silicone layer formed over the semiconductor structure.

Any suitable wavelength converting material may be used. Examples of suitable yellow/green emitting phosphors include $Lu_{3-x-y}M_yAl_{5-z}A_zO_{12}:Ce_x$ where M=Y, Gd, Tb, Pr, Sm, Dy; A=Ga, Sc; and ($0<x\leqq0.2$); $Ca_{3-x-y}M_ySc_{2-z}A_zSi_3O_{12}:Ce_x$ where M=Y, Lu; A=Mg, Ga; and ($0<x\leqq0.2$); $Ba_{2-x-y}M_ySiO_4:Eu_x$ where M=Sr, Ca, Mg and ($0<x\leqq0.2$); $Ba_{2-x-y-z}M_yK_zSi_{1-z}P_zO_4:Eu_x$ where M=Sr, Ca, Mg and ($0<x\leqq0.2$); $Sr_{1-x-y}M_yAl_{2-z}Si_zO_{4-z}N_z:Eu_x$ where M=Ba, Ca, Mg and ($0<x\leqq0.2$); $M_{1-x}Si_2O_2N_2:Eu_x$ where M=Sr, Ba, Ca, Mg and ($0<x\leqq0.2$); $M_{3-x}Si_6O_9N_4:Eu_x$ where M=Sr, Ba, Ca, Mg and ($0<x\leqq0.2$); $M_{3-x}Si_6O_{12}N_2:Eu_x$ where M=Sr, Ba, Ca, Mg and ($0<x\leqq0.2$); $Sr_{1-x-y}M_yGa_{2-z}Al_zS_4:Eu_x$ where M=Ba, Ca, Mg and ($0<x\leqq0.2$); $Ca_{1-x-y-z}M_zS:Ce_xA_y$ where M=Ba, Sr, Mg; A=K, Na, Li; and ($0<x\leqq0.2$); $Sr_{1-x-z}M_zAl_{1+y}Si_{4.2-y}N_{7-y}O_{0.4+y}:Eu_x$ where M=Ba, Ca, Mg and ($0<x\leqq0.2$); $Ca_{1-x-y-z}M_ySc_2O_4:Ce_xA_z$ where M=Ba, Sr, Mg; A=K, Na, Li; and ($0<x\leqq0.2$); $M_{x-2}Si_{6-y-2x}Al_{y+2x}O_yN_{8-y}:Eu_z$ where M=Ca, Sr, Mg and ($0<x\leqq0.2$); and $Ca_{8-x-y}M_yMgSiO_4Cl_2:Eu_x$ where M=Sr, Ba and ($0<x\leqq0.2$). Examples of suitable red emitting phosphors include $Ca_{1-x-z}M_zS:Eu_x$ where M=Ba, Sr, Mg, Mn and ($0<x\leqq0.2$); $Ca_{1-x-y}M_ySi_{1-z}Al_{1+z}N_{3-z}O_z:Eu_x$ where M=Sr, Mg, Ce, Mn and ($0<x\leqq0.2$); $Mg_4Ge_{1-x}O_5F:Mn_x$ where ($0<x\leqq0.2$); $M_{2-x}Si_{5-y}Al_yN_{8-y}O_y:Eu_x$ where M=Ba, Sr, Ca, Mg, Mn and ($0<x\leqq0.2$); $Sr_{1-x-y}M_ySi_{4-z}Al_{1+z}N_{7-z}O_z:Eu_x$ where M=Ba, Ca, Mg, Mn and ($0<x\leqq0.2$); and $Ca_{1-x-y}M_ySiN_2:Eu_x$ where M=Ba, Sr, Mg, Mn and ($0<x\leqq0.2$).

In some embodiments of the invention, a filter layer 40 is formed over wavelength converting layer 38. Filter layer 40 is designed to recycle parts of the spectrum emitted by the wavelength converting layers that are absorbed by RGB filter layer 26. For example, a device with two wavelength converting materials may emit light having a blue peak wavelength, a green peak wavelength, and a red peak wavelength. Filter 40 may reflect light having a peak wavelength between the green and blue peak wavelengths, between the green and red peak wavelengths, or both. Filter 40 may be, for example, a stack of dielectric layers that form a distributed Bragg reflector. A DBR may be deposited on a ceramic phosphor 38 at a wafer level, then diced into individual devices at the same time as the ceramic phosphor.

Figure 4:
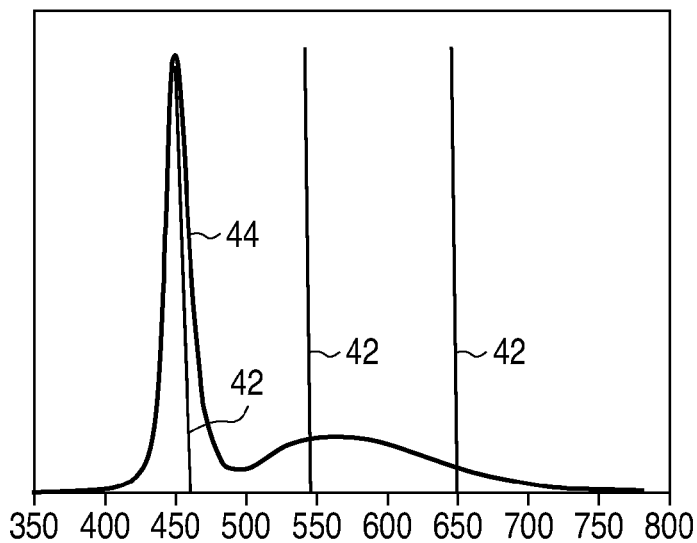
FIG. 4 illustrates the spectra of a blue-emitting LED plus a yellow-emitting phosphor and of an ideal source for a display device using RGB filters.

FIG. 4 is a plot of intensity as a function of wavelength. Lines 42 represent the spectrum of an ideal light source with very narrow peaks 42 located within the transmission bands of RGB filter layer 26 of FIGS. 2 and 9. Spectrum 44 represents the spectrum of a blue emitting LED combined with a yellow-emitting phosphor. Parts of spectrum 44 between peaks 42 are absorbed by RGB filter layer 26. Filter 40 of FIG. 3 is designed to transmit light at wavelengths that are passed by RGB filter layer 26, and to recycle a portion of the light at wavelengths that are absorbed by RGB filter layer 26. The recycled light is reflected back into wavelength converting layers 36 and 38, where it may be absorbed by the phosphor and emitted as light at a wavelength that is transmitted by filter 40. In some embodiments, filter 40 reflects light emitted by one or both of wavelength converting layers 36 and 38.

In order to efficiently recycle light back into wavelength converting layers 36 and 38, in some embodiments filter 40 is located as close as possible to wavelength converting layer 38. In the device illustrated in FIG. 3, the bottom surface of filter 40 is, for example, within 10 μm of the top surface of wavelength converting layer 38, and within 500 μm of the top surface of semiconductor structure 34.

Figure 7:
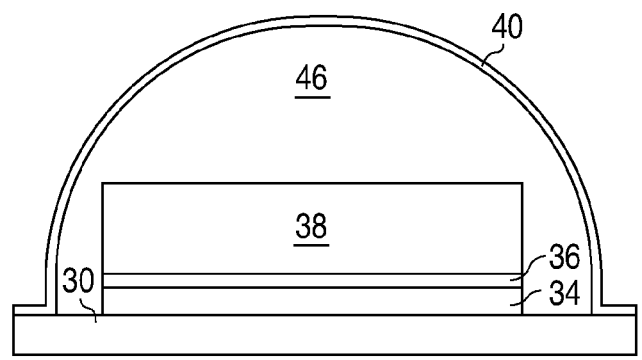
FIG. 7 is a cross sectional view of a phosphor-converted LED according to alternative embodiments of the invention.
Figure 8:
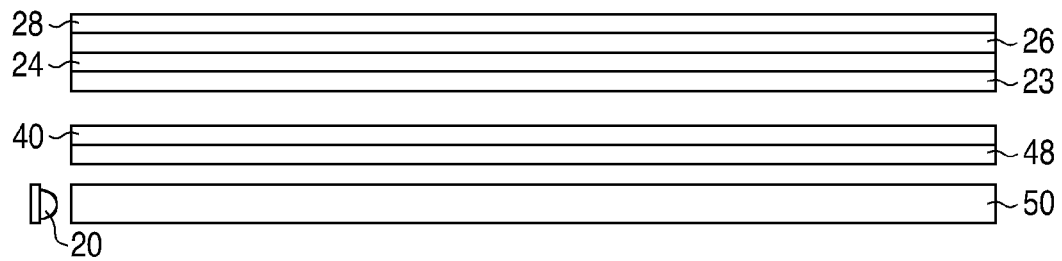
FIG. 8 is a cross sectional view of a portion of an alternative embodiment of a liquid crystal display.

In some embodiments, filter 40 is spaced apart from the semiconductor structure, as illustrated in FIGS. 7 and 8. In the device illustrated in FIG. 7, wavelength converting layers 36 and 38 are disposed over semiconductor structure 34, which is supported by base 30. A transparent cover 46 is disposed over the wavelength converting layers. Cover 46 may be shaped into a lens. An optional adhesive layer may be disposed between cover 46 and wavelength converting layer 38. Filter 40 may be formed over cover 46. In some embodiments, base 30, semiconductor structure 34, wavelength converting layer 36 and 38 and optional cover 46 are formed from materials that can withstand the fabrication of filter layer 40. Multiple bases 30 may be connected together in a wafer, with individual semiconductor structures and wavelength converting layers connected to each base. The entire wafer may be placed in a deposition chamber and filter 40 may be formed over the entire wafer of devices at the same time, in a batch process.

In the device illustrated in FIG. 8, both filter 40 and any wavelength converting materials 48 are spaced apart from the semiconductor structure. FIG. 8 shows an alternative embodiment of a liquid crystal display. Liquid crystal layer 28, RGB filter layer 26, BEFs 24 and diffusers 23 are described above in reference to FIG. 2. Light source 20, which may be a phosphor-converted LED or blue or UV emitting LED, emits light into a light guide 50, which may be, for example, a plastic sheet. Filter 40 is disposed between light guide 50 and RGB filter layer 26. For example, filter 40 may be formed as a sheet or on a sheet of transparent material. Any wavelength converting materials 48 used in the structure to make white light, such as the yellow/green and red emitting phosphors described above, may be optionally connected to filter 40. For example, wavelength converting materials 48 may be formed as a sheet connected to filter 40, or formed on or within a sheet of transparent material on which filter 40 is formed. Examples of suitable transparent materials on or within which wavelength converting materials and/or filter materials may be formed are glass, plastics such as PET and PC, and any other suitable material. The wavelength converting materials may be formed on a transparent sheet by, for example, slot-die coating, rod coating, inkjet printing, spray coating, painting, or any other suitable technique.

Figure 5:
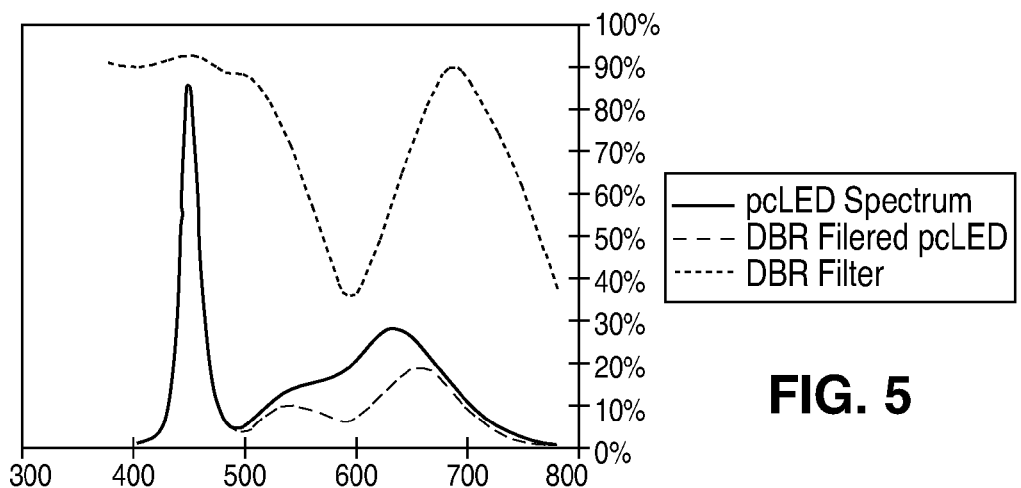
FIGS. 5 and 6 illustrate the spectra of two devices including a blue-emitting LED and yellow- and red-emitting phosphors, before and after passing through a filter.

FIG. 5 is a plot of intensity as a function of wavelength for a simulation of a first example of a device as illustrated in FIG. 3. In the device shown in FIG. 5, a yellow/green-emitting $Y_3Al_5O_{12}:Ce^{3+}$ ceramic phosphor (wavelength converting layer 38 in FIG. 3) is combined with a phosphor given by the general formula $(Ca_{1-x-y-z}Sr_xBa_yMg_z)_{1-n}(Al_{1-a+b}B_a)Si_{1-b}N_{3-b}O_b:RE_n$, wherein $0 \leq x \leq 1$, $0 \leq y \leq 1$, $0 \leq z \leq 1$, $0 \leq a \leq 1$, $0 < b \leq 1$ and $0.002 \leq n \leq 0.2$ and RE is selected from europium (II) and cerium(III). The second phosphor is generally $CaAlSiN_3:Eu^{2+}$, which emits red light. The red-emitting phosphor and may be disposed in a transparent material such as silicone (wavelength converting layer 36 in FIG. 3). Filter 40 is a ten-period DBR stack of alternating layers of $HfO_2$ and $SiO_2$.

In FIG. 5, the solid line illustrates the spectrum of the wavelength-converted LED. The dotted line illustrates the spectrum of filter 40, shown in FIG. 3. The dashed line illustrates the spectrum of light from the wavelength-converted LED after passing through filter 40. As illustrated in FIG. 5, filter 40 is configured to transmit light at the peaks emitted by the two phosphors, at about 540 and 660 nm, and reflect amber light between the two peaks, at about 600 nm. Improving the separation between the yellow/green peak and the red peak in the spectrum may improve the gamut. The addition of filter 40 to the device illustrated in FIG. 5 improves the color gamut from 70% of NTSC for just the wavelength-converted LED to 79% for the wavelength-converted LED plus the filter, for the same color temperature of 9000 K.

Figure 6:
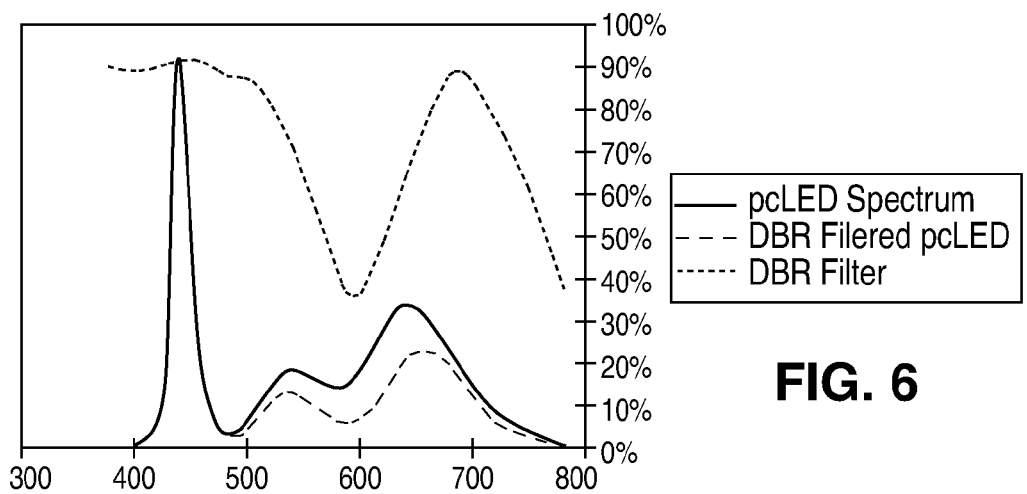

FIG. 6 is a plot of intensity as a function of wavelength for a simulation of a second example of a device as illustrated in FIG. 3. In the device shown in FIG. 6, a first phosphor given by the general formula $(Sr_{1-a-b}Ca_bBa_c)Si_xN_yO_z:Eu_a^{2+}$ (a=0.002-0.2, b=0.0-0.25, c=0.0-0.25, x=1.5-2.5, y=1.5-2.5, z=1.5-2.5) is combined with a second phosphor given by the general formula $(Ca_{1-x-y-z}Sr_xBa_yMg_z)_{1-n}(Al_{1-a+b}B_a)Si_{1-b}N_{3-b}O_b:RE_n$, wherein $0 \leq x \leq 1$, $0 \leq y \leq 1$, $0 \leq z \leq 1$, $0 \leq a \leq 1$, $0 < b \leq 1$ and $0.002 \leq n \leq 0.2$ and RE is selected from europium (II) and cerium(III). The first phosphor may be a green-emitting phosphor such as $SrSi_2N_2O_2:Eu^{2+}$ formed into a ceramic (wavelength converting layer 38 in FIG. 3) and the second phosphor may be a red-emitting phosphor such as $CaAlSiN_3:Eu^{2+}$ disposed in a transparent material such as silicone (wavelength converting layer 36 in FIG. 3). Filter 40 is a ten-period DBR stack of alternating layers of $HfO_2$ and $SiO_2$.

As in FIG. 5, in FIG. 6 the solid line illustrates the spectrum of the wavelength-converted LED, the dotted line illustrates the spectrum of filter 40, and the dashed line illustrates the spectrum of light from the wavelength-converted LED after passing through filter 40. As illustrated in FIG. 6, filter 40 is configured to transmit light at the peaks emitted by the two phosphors, at about 530 and 660 nm, and reflect light between the two peaks, at about 600 nm. The addition of filter 40 to the device illustrated in FIG. 6 improves the color gamut from 77% of NTSC for just the wavelength-converted LED to 87% for the wavelength-converted LED plus the filter, for the same color temperature of 9000 K.

Many variations of the above-described embodiments are within the scope of the invention. Any other suitable phosphors or phosphor combinations may be used. Two or more phosphors may be mixed in a single layer. Other fluorescent materials, such as dyes, may be used in place of phosphors. Other forms of phosphor and other phosphor deposition techniques may be used, besides the ceramic and powder phosphors described above. For example, phosphors maybe formed by electrophoretic deposition, screen printing, or stenciling, or deposited in thin film form. A blue-emitting LED may include phosphors in addition to a yellow/green-emitting phosphor and a red-emitting phosphor. Alternatively, a UV-emitting LED may be combined with a blue-emitting phosphor, a yellow/green-emitting phosphor, and a red-emitting phosphor, and any additional phosphors. Elements of different embodiments or examples may be combined.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:
1. A structure comprising:
   a semiconductor light emitting device 34 comprising a light emitting layer disposed between an n-type region and a p-type region, wherein the light emitting layer is adapted to emit first light having a first peak wavelength;
   a first wavelength converting material 38 adapted to absorb the first light and emit second light having a second peak wavelength;

a second wavelength converting material 36 adapted to absorb one of the first light and the second light and emit third light having a third peak wavelength;

wherein the first and second wavelength converting materials are disposed in a path of light emitted by the semiconductor light emitting device; and a filter 40 adapted to reflect fourth light having a fourth peak wavelength and transmit light having a peak wavelength longer or shorter than the fourth peak wavelength, wherein the fourth light comprises one of a portion of the second light and a portion of the third light, and wherein the filter is disposed in the path of at least a portion of the first, second, and third light.

2. The structure of claim 1 wherein:
the first wavelength converting material 38 is disposed in a ceramic layer; and
the second wavelength converting material 36 is a powder disposed in a transparent material layer.

3. The structure of claim 1 wherein the first wavelength converting material 38 and the second wavelength converting material 36 are powders that are mixed and disposed in a transparent material disposed over the semiconductor light emitting device 34.

4. The structure of claim 1 wherein:
at least one of the first wavelength converting material 38 and the second wavelength converting material 36 is disposed on the semiconductor light emitting device 34, and
the filter 40 is in direct contact with one of the first and second wavelength converting materials.

5. The structure of claim 1 wherein the filter 40 is a distributed Bragg reflector.

6. The structure of claim 1 wherein a surface of the filter 40 is within 500 μm of a surface of the semiconductor light emitting device 34.

7. The structure of claim 1 wherein the filter 40 comprises a stack of dielectric layers.

8. The structure of claim 1 wherein the filter 40 is a first filter, the structure further comprising a second filter layer 26 comprising:
a plurality of first pixel locations, wherein at each first pixel location the second filter is adapted to transmit red light and absorb green and blue light;
a plurality of second pixel locations, wherein at each second pixel location the second filter is adapted to transmit green light and absorb red and blue light; and
a plurality of third pixel locations, wherein at each third pixel location the second filter is adapted to transmit blue light and absorb red and green light.

9. The structure of claim 1 wherein at least one of the first wavelength converting material 38 and the second wavelength converting material 36 is spaced apart from the semiconductor light emitting device 34.

10. The structure of claim 1 wherein the fourth peak wavelength is between the first peak wavelength and the second peak wavelength.

11. The structure of claim 1 wherein the fourth peak wavelength is between the second peak wavelength and the third peak wavelength.

12. A structure comprising:
at least one light source 20 comprising a semiconductor light emitting device;
a first filter layer 26 disposed over the at least one light source, wherein the first filter layer comprises:
a plurality of first pixel locations, wherein at each first pixel location the first filter is adapted to transmit light at a first peak wavelength and absorb light at second and third peak wavelengths;
a plurality of second pixel locations, wherein at each second pixel location the first filter is adapted to transmit light at the second peak wavelength and absorb light at the first and third peak wavelengths; and
a plurality of third pixel locations, wherein at each third pixel location the first filter is adapted to transmit light at the third peak wavelength and absorb light at the first and second peak wavelengths;
a liquid crystal layer 28 disposed over the first filter layer; and
a second filter layer 40 disposed between the at least one light source and the first filter layer, wherein the second filter layer is adapted to transmit light at the first, second, and third peak wavelengths and reflect light at a fourth peak wavelength.

13. The structure of claim 12 wherein the first filter layer 26 is adapted to absorb light of the fourth peak wavelength.

14. The structure of claim 12 wherein:
the semiconductor light emitting device is configured to emit light having a blue peak wavelength;
the light source further comprises a first wavelength converting material 38 adapted to emit light having a green or yellow peak wavelength and a second wavelength converting material 36 adapted to emit light having a red peak wavelength; and
the second filter layer 40 is disposed in direct contact with one of the first and second wavelength converting materials.

* * * * *